United States Patent
Okamura et al.

[11] Patent Number: 6,147,329
[45] Date of Patent: Nov. 14, 2000

[54] RESIST PROCESSING SYSTEM AND RESIST PROCESSING METHOD

[75] Inventors: Kouji Okamura; Masami Akimoto, both of Kumamoto, Japan

[73] Assignee: Tokyo Electron Limited, Tokyo, Japan

[21] Appl. No.: 09/137,674

[22] Filed: Aug. 21, 1998

Related U.S. Application Data

[62] Division of application No. 08/582,280, Jan. 3, 1996.

[30]    Foreign Application Priority Data

Jan. 13, 1995   [JP]   Japan ................................. 7-021373

[51] Int. Cl.$^7$ ..................................................... F27B 5/14
[52] U.S. Cl. ......................... 219/390; 118/729; 432/128
[58] Field of Search .......................... 432/128; 219/388, 219/390; 118/729

[56]    References Cited

U.S. PATENT DOCUMENTS

| | | | |
|---|---|---|---|
| 5,015,177 | 5/1991 | Iwata . | |
| 5,061,144 | 10/1991 | Akimoto et al. ........................ | 414/225 |
| 5,226,056 | 7/1993 | Kikuchi et al. ............................ | 373/18 |
| 5,228,052 | 7/1993 | Kikuchi et al. ............................ | 373/18 |
| 5,442,416 | 8/1995 | Tateyama et al. ....................... | 354/319 |
| 5,516,608 | 5/1996 | Hobbs et al. . | |
| 5,536,128 | 7/1996 | Shimoyashiro et al. ................. | 414/273 |
| 5,578,127 | 11/1996 | Kimura ..................................... | 118/695 |

*Primary Examiner*—Teresa Walberg
*Assistant Examiner*—Shawntina L. Fuqua
*Attorney, Agent, or Firm*—Oblon, Spivak, McClelland, Maier & Neustadt, P.C.

[57]    ABSTRACT

The substrate unloaded from the exposure device is received at the interface unit, and then carried by the substrate carrying means to the heat treatment unit, where a heat treatment is carried out on the substrate. After that, the substrate is carried from the heat treatment unit to the cooling unit, where the substrate is cooled. After the completion of the cooling process, the substrate is carried by the carrying means from the cooling unit to the development unit, where the resist film on the substrate is developed. In this resist process, the required time for the process at the heat treatment unit is changed in accordance with the required time for the process at the exposure unit. The required time for the process at the heat treatment unit is equalized with the required time for the process at the exposure device. The required time for the process at the heat treatment process is changed by prolonging or shortening the pre-process at the heat treatment unit.

15 Claims, 8 Drawing Sheets

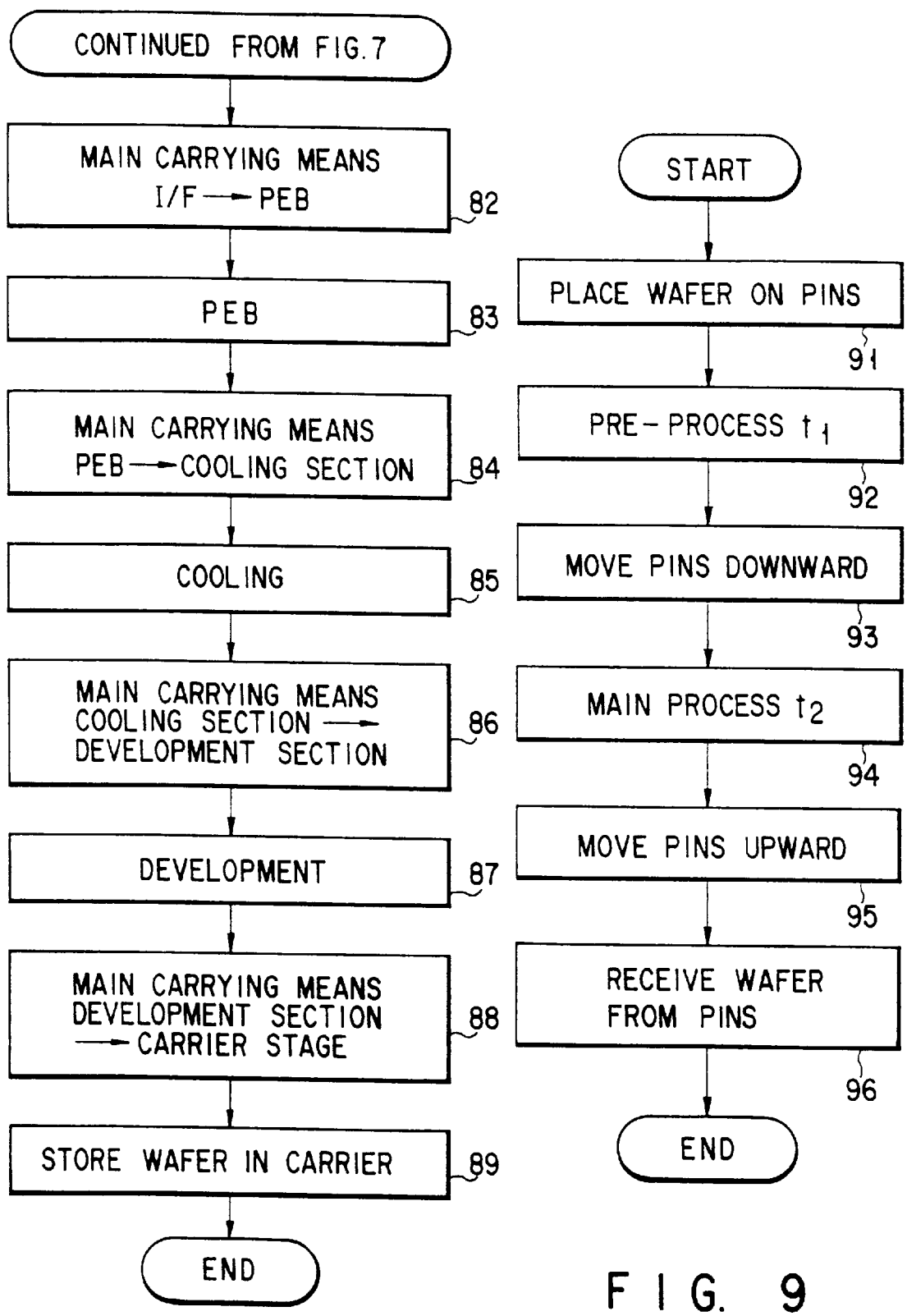

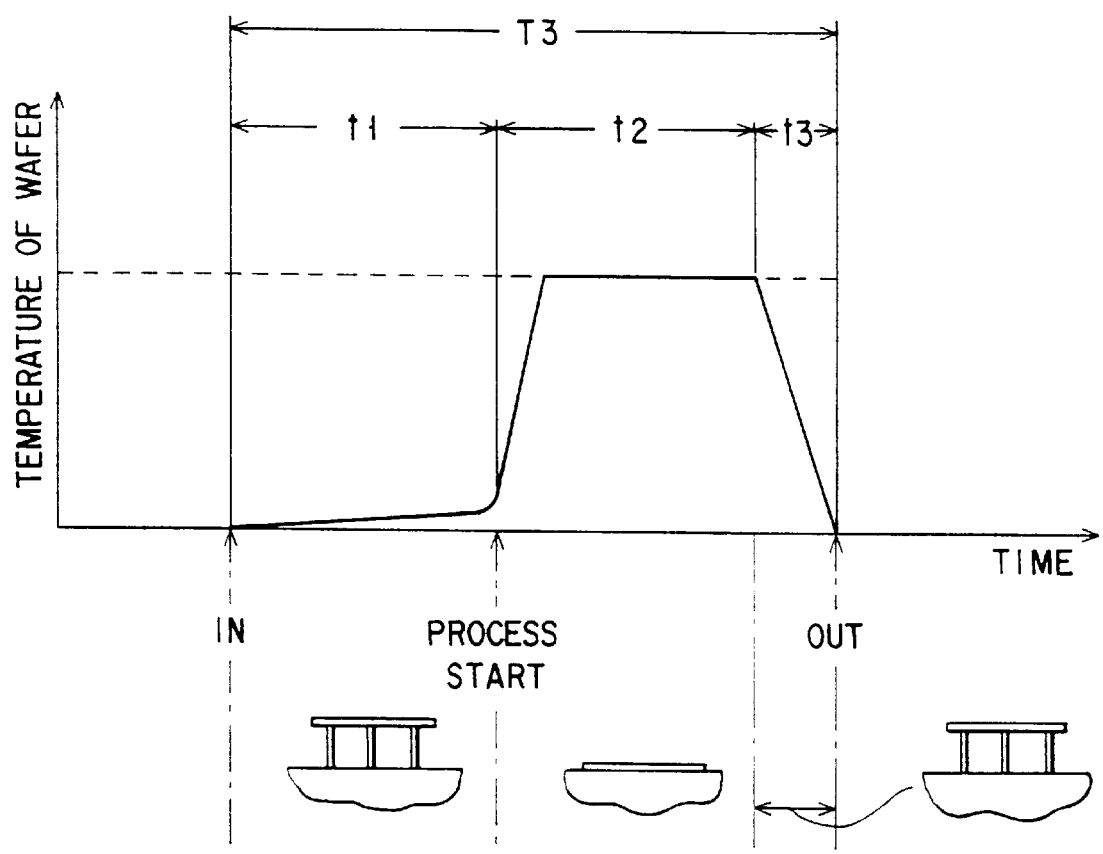
F I G. 10

RESIST PROCESSING SYSTEM AND RESIST PROCESSING METHOD

This application is a Division of Ser. No. 08/582,280 filed Jan. 3, 1996.

BACKGROUND OF THE INVENTION

1. Field of the Invention

The present invention relates to a resist processing system, and a resist processing method.

2. Description of the Related Art

For example, in a photolithography step of a process of manufacturing a semiconductor device, a coating-development-exposure system is used. The coating-development-exposure system includes a coating-development unit for forming a resist film by applying a resist on the surface of a semiconductor wafer and for developing the resist film, and an exposure unit for carrying out an exposure process on the resist film. The coating-development unit has an interface for loading/unloading wafers between the exposure unit and itself.

In the interface, the wafers exposed by the exposure unit are received by the first carrying means and passed to the second carrying means which are provided in the coating-development unit. Then, the second carrying means carries the wafers to each of the processing devices. For example, the second carrying means carries the wafers to an oven provided in the coating-development unit. In this oven, the wafers are subjected to a post exposure baking (PEB) process. After the PEB process is completed, the wafers are carried to a cooling device. In this cooling device, the wafers are cooled. After the cooling, the wafers are carried by the second carrying means to each of the processing devices, where further necessary processes are carried out on the wafers successively, such as a development process.

In a conventional coating-development-exposure system, for the purpose of improving the throughput, the second carrying means provided in the coating-development unit moves at all times between the processing units including the interface, the oven and the cooling device, so that the wafers are continuously carried between the processing units. In order to further improve the throughput, it is preferable that the wait time, that is the time period from when the second carrying means arrives at the interface or each of the processing devices of the coating-development processing unit, to when the loading/unloading of wafers is started, should be shortened as much as possible. In the conventional coating-development-exposure system, an operation timing of the second carrying means is set in advance on the basis of time set for each one of the procedures carried out by the exposure unit and the coating-development unit.

However, in some cases, the exposure unit requires a more time than the predetermined set time required for the exposure unit. More specifically, in the case where the alignment of a wafer is not accurately completed in one time for some reason and the alignment must be carried out two times or more, or where the projection exposure time is prolonged due to a decrease in the light intensity of the light source, the operation time required in the exposure unit is prolonged.

As described above, in the conventional coating-development-exposure system, the operation timing of the second carrying means in the coating-development unit is set on the basis of the predetermined set time required for the exposure unit. Therefore, in the case where the actual time required for the exposure unit is longer than the preset time, a wafer is not present at the interface at the preset timing. Regardless of whether or not a wafer is present, the second carrying means operates in the preset timing and carries out the operation of receiving a wafer when arrives at the interface. Then, the second carrying means moves on to the oven without receiving a wafer. In a normal operation at the oven, the second carrying means unloads a wafer which has been subjected to the PEB process, and load a not-yet-processed wafer. However, even in the case where the second carrying means receives no wafer which has been exposed, the means carries out the operation of carrying a wafer into the oven, without a wafer. As described above, the second carrying means, without having a wafer, carries out a wafer carrying operation consecutively between the processing devices such as the oven and the cooling device provided in the coating-development unit. As a result, the throughput of the resist process in the coating-development-exposure system is extremely decreased.

In the interface, a wafer which is received from the exposure unit later than the preset timing, must wait the second carrying means to come around and back there again, at a wafer loading/unloading position of the interface, where wafers are loaded/unloaded to/from the second carrying means. If there is a long time elapse between the wafer exposure process and the PEB process, the line width of the resist pattern which has been subjected to the exposure changes in the time elapse when the resist material is a chemical amplification type. Therefore, it may not be possible to obtain a desired width of a resist pattern.

SUMMARY OF THE INVENTION

An object of the present invention is to provide a resist processing system capable of improving the throughput of the resist process, by changing the operation timing of the second carrying means in accordance with an actual time required for the exposure process.

Another object of the present invention is to provide a resist processing method capable of improving the throughput of the resist process by changing the operation timing of the second carrying means in accordance with an actual time required for the exposure process.

According to the first aspect of the present invention, there is provided a resist processing apparatus for performing a resist process on a substrate, comprising: a heat treatment unit for carrying out a heat treatment on the substrate having a surface on which a resist film is formed; a cooling unit for cooling the substrate on which the heat treatment was carried out by the heat treatment unit; a development unit for developing the resist film formed on the surface of the substrate which was cooled by the cooling unit; an interface unit for passing the substrate between the interface unit itself and an exposure device; substrate carrying means for carrying the substrate between the heat treatment unit, the cooling unit, the development unit and the interface unit; and a control unit capable of controlling an operation of at least the heat treatment unit and the substrate conveying means and of changing a required time for a process at the heat treatment unit in accordance with a required time for a process of the substrate at the exposure unit.

According to the second aspect of the present invention, there is provided a resist processing method for performing a resist process on a substrate, by use of a resist processing apparatus for performing a resist process on a substrate, including: a heat treatment unit for carrying out a heat treatment on the substrate having a surface on which a resist film is formed; a cooling unit for cooling the substrate on which the heat treatment was carried out by the heat treatment unit; a development unit for developing the resist film formed on the surface of the substrate which was cooled by the cooling unit; an interface unit for passing the substrate between the interface unit itself and an exposure device; and substrate carrying means for carrying the substrate between the heat treatment unit, the cooling unit, the development unit and the interface unit; the method comprising the steps of: receiving the substrate unloaded from the exposure device, at the interface unit; carrying the substrate from the interface unit to the heat treatment unit by the substrate carrying means; subjecting the substrate to a heat treatment in the heat treatment unit; carrying the substrate from the heat treatment unit to the cooling unit by the substrate carrying means; cooling the substrate in the cooling unit; carrying the substrate from the cooling unit to the development unit by the substrate carrying means; and developing the resist film on the substrate in the development unit; wherein a required time for a process at the heat treatment unit is changed on the basis of a required time for a process at the exposure unit.

According to the third aspect of the present invention, there is provided a resist processing method for performing a resist process on a substrate, comprising the steps of: receiving the substrate unloaded from the exposure device, at the interface unit; carrying the substrate from the interface unit to the heat treatment unit by the substrate carrying means; subjecting the substrate to a heat treatment in the heat treatment unit; carrying the substrate from the heat treatment unit to the cooling unit by the substrate carrying means; cooling the substrate in the cooling unit; carrying the substrate from the cooling unit to the development unit by the substrate carrying means; and developing the resist film on the substrate in the development unit; wherein a required time for a process at the heat treatment unit is changed on the basis of a required time for a process at the exposure unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 7 and 8 are a series of flowcharts illustrating the steps of the resist process according to the present invention;

FIG. 9 is a flowchart showing the steps of the PEB process of the resist process according to the present invention; and FIG. 10 is a graph showing a correlation between the wafer temperature and the time elapse in the PEB process.

DETAILED DESCRIPTION OF THE PREFERRED EMBODIMENTS

The present invention will now be described in further detail with reference to accompanying drawings.

Figure 1:
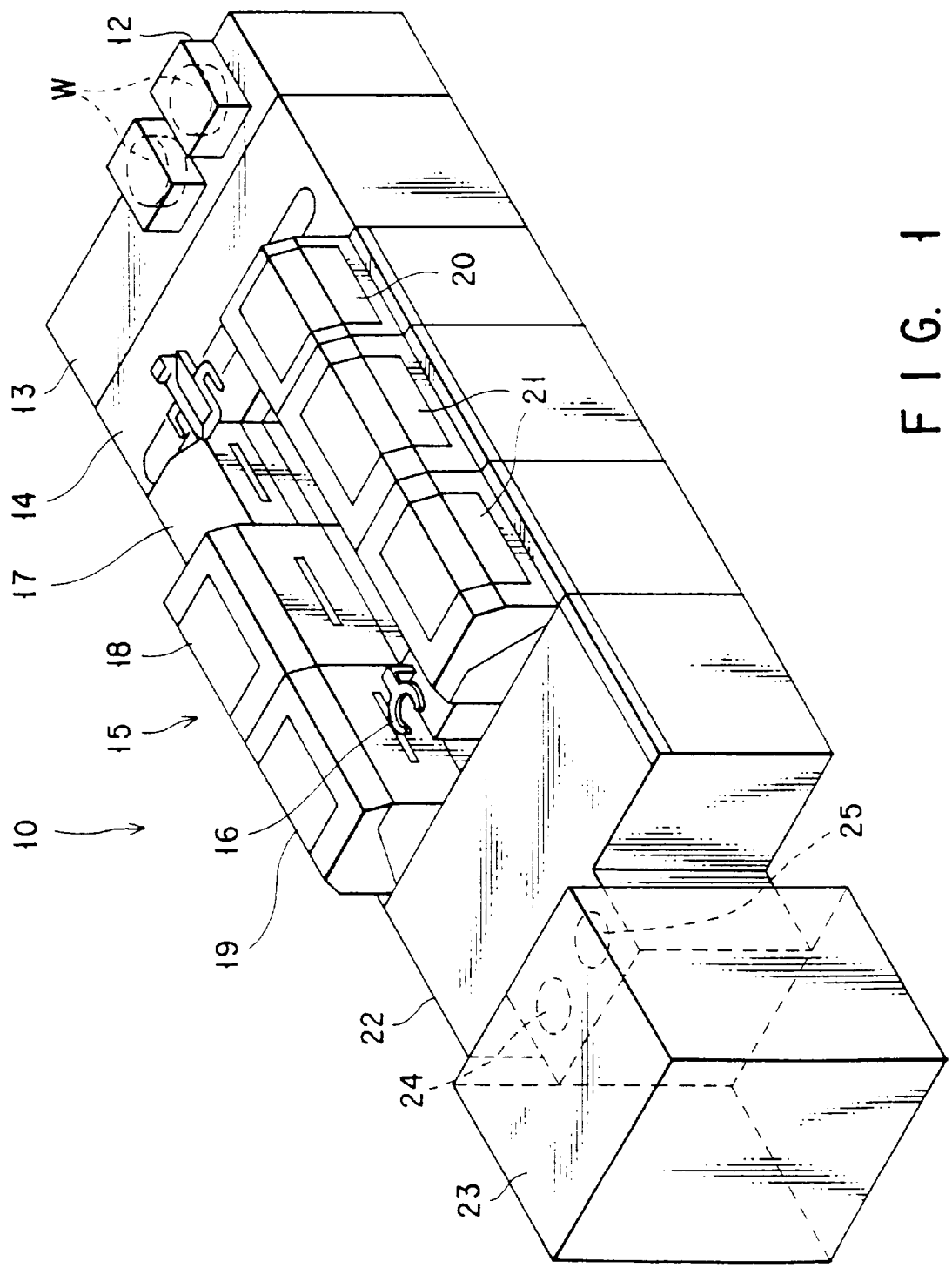
FIG. 1 is a perspective view of an embodiment of the resist processing system according to the present invention.

FIG. 1 is a perspective view of an embodiment of the resist processing system according to the present invention. FIG. 1 includes a carrier stage 11 having a structure on which a plurality of carriers 12 each serving as a container capable of holding a plurality of substrates to be processed, for example, semiconductor wafers, and the carrier stage is designed for loading/unloading the carriers 12. A carrying mechanism 14 for loading/unloading a semiconductor wafer W to/from a carrier 12, is provided so as to be continuous to the carrier stage 11.

The figure also shows a coating-development section 15. A main carrying means 16 is provided at a center portion of the coating-development unit 15. Along one side of the main carrying means 16, a bake section 17, a cooling section 18 and an adhesion section 20 are provided in the order from the carrying mechanism 14. Along the opposite side of the means 16, a development section 20 and a plurality of coating sections 21 are provided in the order from the carrying mechanism 14. The coating-development unit 15 includes a interface (I/F) 22 for passing wafers W between the exposure unit 23 and the unit 15 itself.

Figure 2:
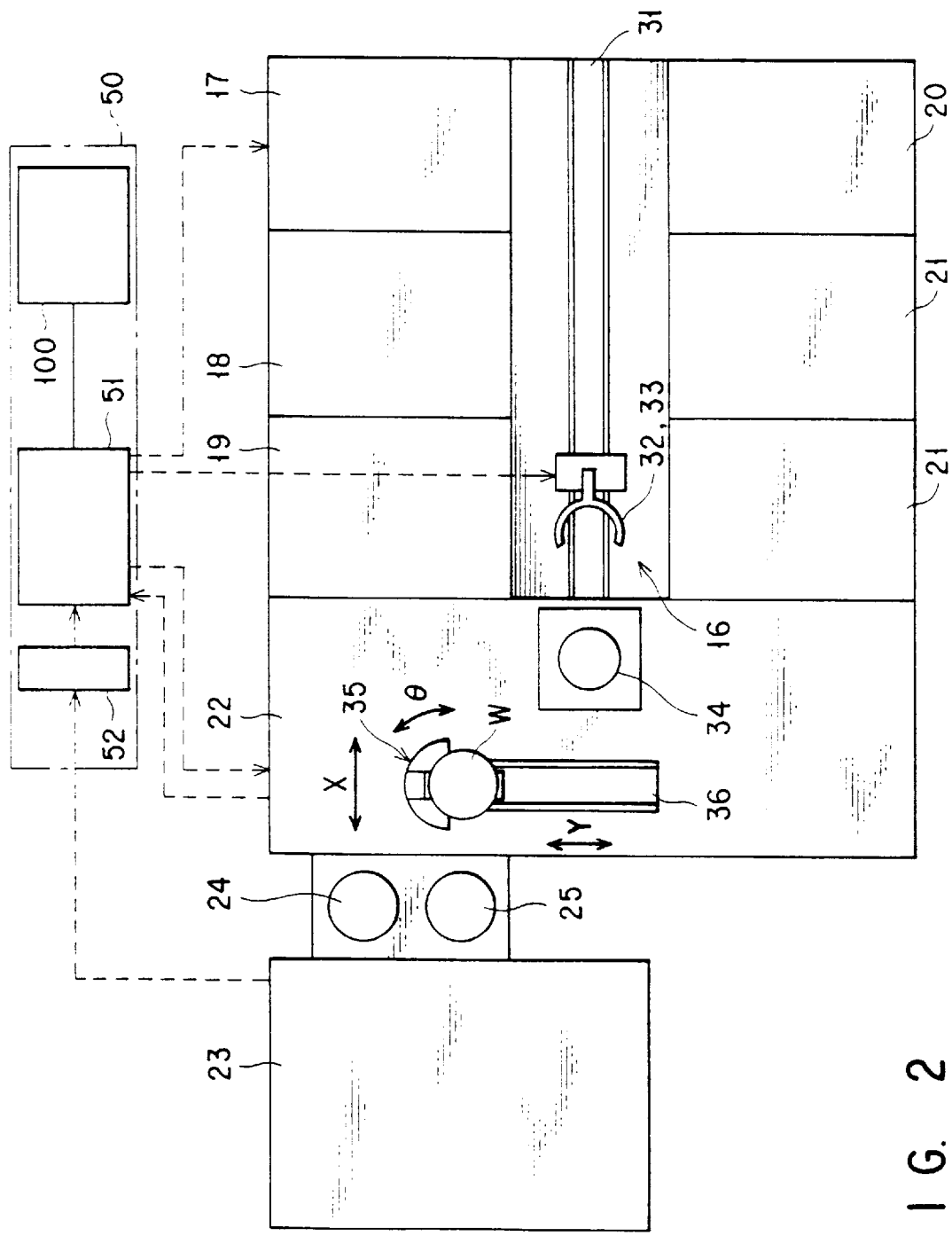
FIG. 2 is a plan view of the embodiment of the resist processing system according to the present invention.
Figure 3:
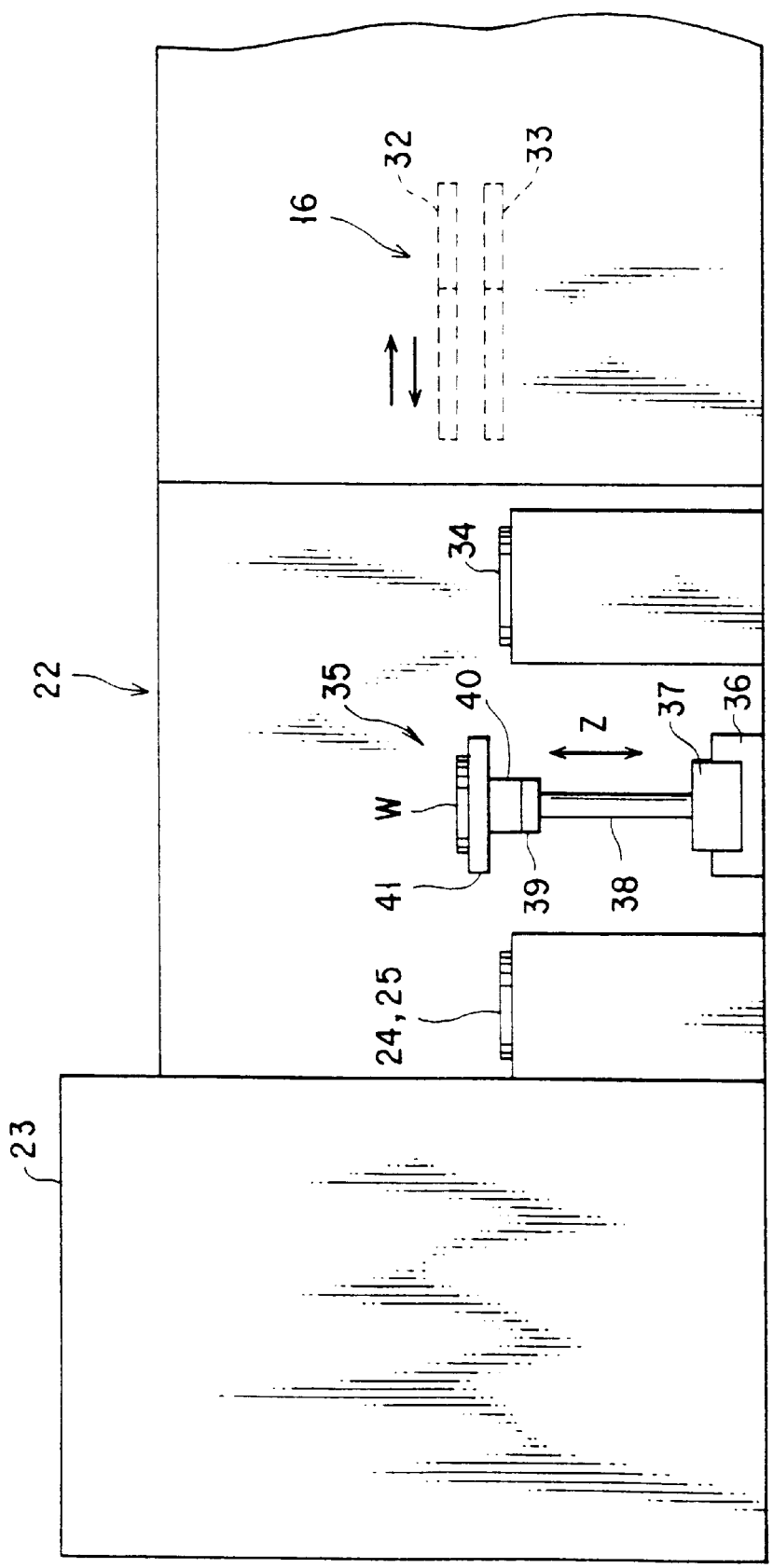
FIG. 3 is a side view of the resist processing system of the present invention, particularly showing the interface thereof.

As shown in FIG. 2, the main carrying means 16 is mounted movably on the carrying route 31, and can be moved along the carrying route 31 by a driving mechanism such as a ball screw. The main carrying means 16 includes two wafer supporting arms 32 and 33 as shown in FIG. 3. The wafer supporting arms 32 and 33 are arranged in parallel to each other with an interval therebetween, in substantially the vertical direction. The wafer supporting arms 32 and 33 can be moved forward and backward independently from each other. The wafer supporting arms 32 and 33 are also able to rotate, by use of rotation driving means (not shown).

An interface 22 has an intermediate stage 34 at a position corresponding to the proximal end of the interface 22 side of the carrying route 31 of the main carrying means 16 as shown in FIG. 2. An input-side stage 24 and an output-side stage 25 are provided between the interface 22 and the exposure unit 23.

The interface 22 has I/F carrying means 35 for passing wafers W between the intermediate stage 34 and either one of the input-side stage 24 and the output-stage 25. The I/F conveying means 35 includes a carrying path 36 (see FIG. 2) and a moving member 37 (see FIG. 3) which is moved in the Y direction on the carrying route 36 by a driving mechanism, for example, a ball spring mechanism. A lifting mechanism 38 is set on the moving member 37, and a rotation mechanism 39 is provided on the lifting mechanism 38. A base 40 is mounted on the rotation mechanism 39. The base 40 is moved upward or downward by the lifting mechanism 38 and rotated by the rotation mechanism 39. A tweezer leg 41, which is designed to support a wafer W, is provided on the base 40 to be movable forward and backward.

Figure 4:
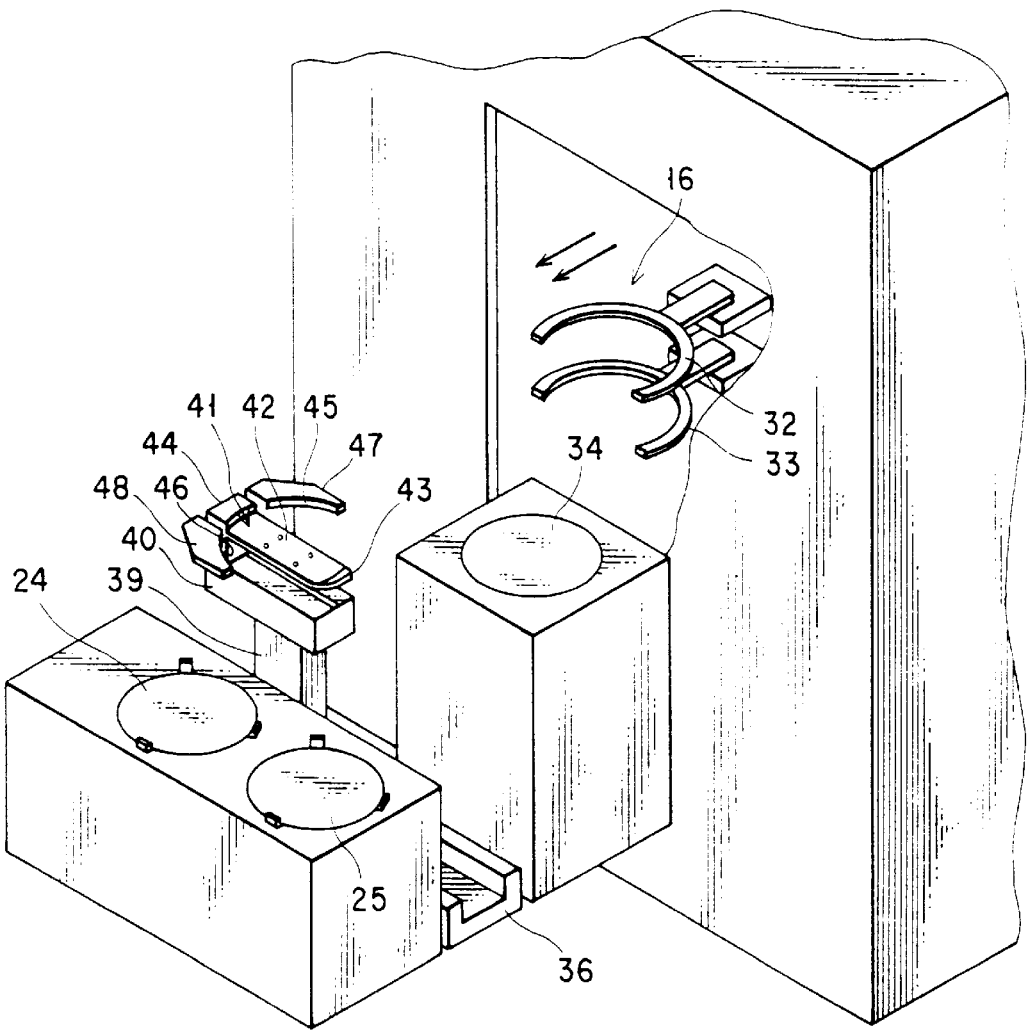
FIG. 4 is a perspective view of the interface of the resist processing system shown in FIG. 1.

As shown in FIG. 4, the tweezer leg 41 has a main stage 42 on which a wafer W is placed, and step-like stoppers 43 and 44 designed for limiting the movement of the wafer W at the front end portion and the rear end portion thereof.

Aligning members 47 and 48 having abutting surfaces 45 and 46, respectively, are provided on the base 40 so as to interpose the tweezer leg 41 therebetween. The abutting surfaces 45 and 46 abut against the peripheral portion of the rear side of a wafer W when the tweezer leg 41 moved back all the way.

A control section 50 of a resist processing system 10, as described above, of the present invention will now be described with reference to FIG. 2.

The control section 50 has a central control device 51. To the central control section 51, a signal is input from the exposure section 23 via a relay device 52. The central control device 51 is designed to be capable of passing signals between the interface 22 and the device 51 itself. Further, the central control device 51 is capable of outputting signals to the bake section 17 and the main carrying means 16. Also, the central control device 51 may output signals to the other sections, for example, the carrying mechanism 14, the cooling section 18, the adhesion section 19, the development section 20 and the coating sections 21. The central control device 51 may include input means and display means.

Figure 5:
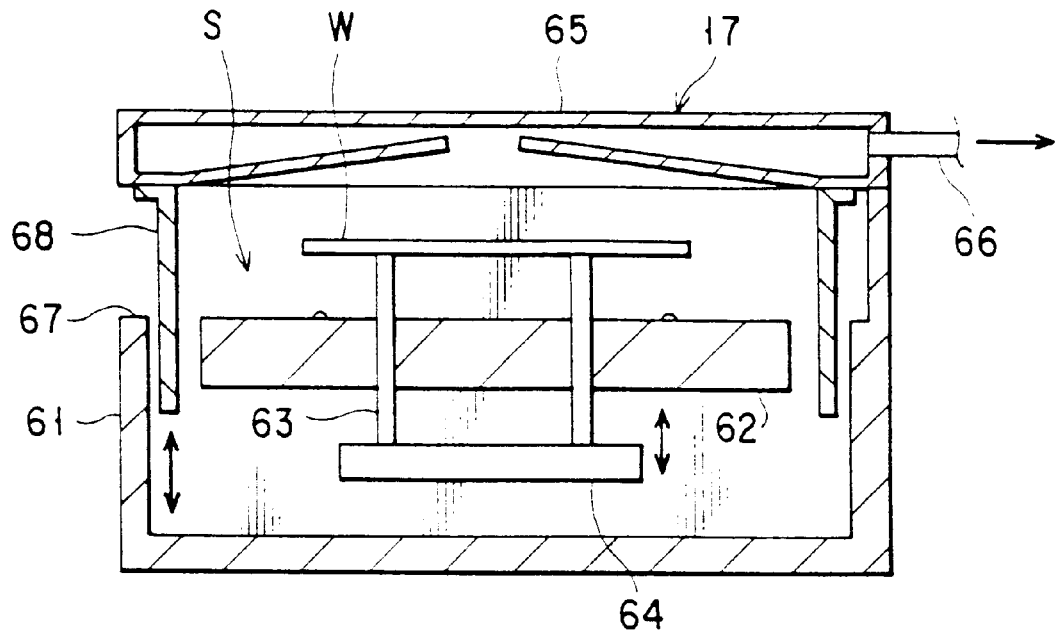
FIGS. 5 and 6 are cross sections of the resist processing system shown in FIG. 1, especially showing the bake section thereof.

FIG. 5 is a cross sectional view of the bake section 17. The bake section 17 has a box 61 the top portion of which is opened. A placement base 62 is provided in the box 61. The placement base 62 has a surface on which a wafer W is placed, and can heat the wafer W. A plurality of, for example, three pins 63 are pierced to be ascendable/descendable, through the placement base 62. The lower end portions of these pins 63 are connected to a frame 64. The frame 64 is connected to the lifting mechanism (not shown).

Figure 6:
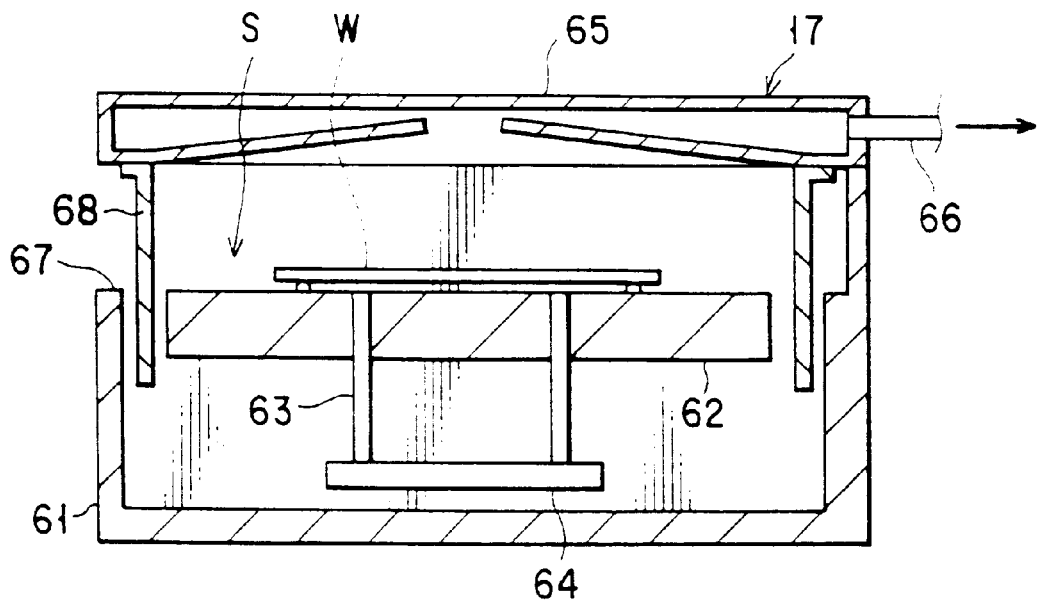

In the case where a wafer W is loaded, the pins 63 are lifted up as shown in FIG. 5, and the wafer W is placed on the pins 63 while the pins 63 lifted up. Next, the pins 63 are put down, and the wafer W is moved on the placement base 62, as shown in FIG. 6. When the wafer W is unloaded, an operation exactly opposite to the above procedure is carried out.

Above the box 61, a cover 65 is provided so as to keep a space S used for loading and unloading a wafer W. An exhaustion duct 66 for exhausting gas generated during the heating process, is connected to the cover 65.

In one side of the box 61, a slit 67 used for loading and unloading a wafer W is made. Inside the box 61, a cylindrical shutter 68 for surrounding the space S and the placement base 62, is provided to be ascendable.

In the resist processing system 10 having the above-described structure, the resist process is carried out, as will be described in the following.

Figure 7:
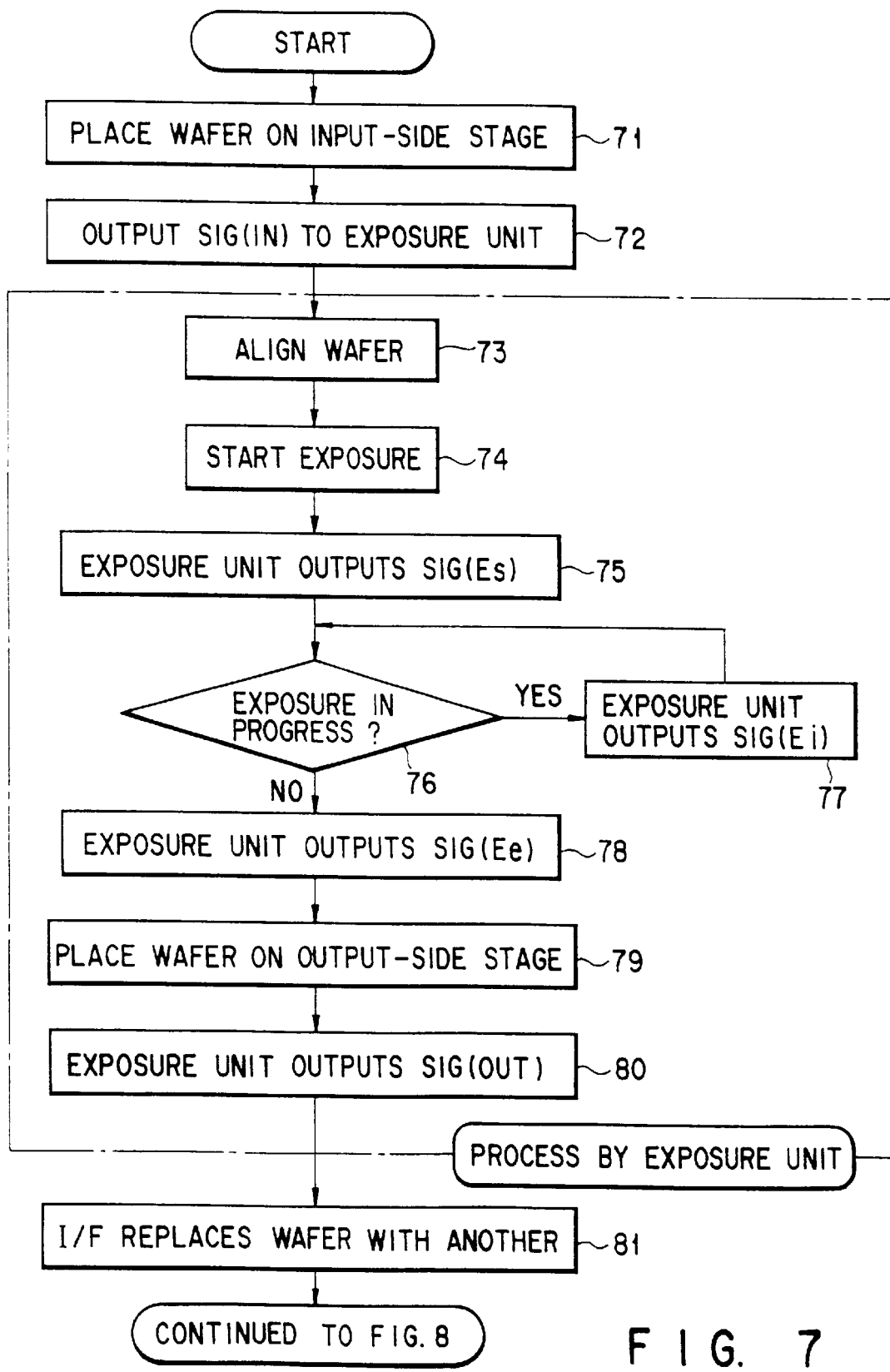

FIGS. 7 and 8 are a series of a flowchart illustrating the steps in the resist process.

First, a wafer W is subjected to the respective processes in the adhesion section 19 and the coating section 21 provided in the coating-development section 15, and a resist film is formed on the surface of the wafer W. Then, the wafer is passed onto the intermediate stage 34 of the interface 22 by the main conveying means 16. Next, the wafer W is placed on the input-side stage 24 by the I/F carrying means 35 (FIG. 7, 71). When the wafer W is placed on the input-side stage 24, the central control device 51 outputs an input-side wafer passing signal SIG (IN) to the exposure unit 23 (FIG. 7, 72).

In the exposure unit 23, the wafer W is aligned (FIG. 7, 73) upon the reception of the input-side wafer passing signal SIG (IN), and then the exposure process is started (FIG. 7, 74). When the exposure process is started, an exposure starting signal SIG (Es) is output to the control section 50 from the exposure unit 23 (FIG. 7, 75). The exposure starting signal SIG (Es) is once input to the relay device 52, where the signal is subjected to necessary processes including a conversion, and then output to the central control device 51.

The control section provided in the exposure unit 23 judges whether or not the exposure process is being performed (FIG. 7, 76). In the case where it is judged that the exposure is in progress, an exposure in-progress signal SIG (Ei) is output from the exposure unit 23 to the control section 50 (FIG. 7, 77). When the exposure is finished, an exposure end signal SIG (Ee) is output from the exposure unit 23 to the control section 50 (FIG. 7, 78). Next, the exposure unit 23 places the wafer W on the output-side stage 25 of the interface 22 (FIG. 7, 79). When the wafer W is placed on the output-side stage 25, an output-side wafer passing signal SIG (OUT) is output from the exposure unit 23 to the control section 50 (FIG. 7, 80). These steps 73 to 80 as described above are performed by the exposure unit 23.

After that, the control section 50 outputs a control signal to the interface 22, and the wafer W is moved from the output-side stage 25 to the intermediate stage 34 by the I/F carrying means 35 (FIG. 7, 81).

When the wafer W is placed on the intermediate stage 34, the control section 50 outputs a control signal to the main carrying means 16, and makes the main carrying means 16 to carry the wafer W from the interface 22 to the base section 17 (FIG. 8, 82).

In the bake section 17, the wafer W is subjected to the PEB process as can be seen in FIG. 9 (FIG. 8, 83). More specifically, first, the main carrying means 16 moves either one of wafer supporting arms 32 and 33, which holds the wafer W, forward, and put it down, and thus the wafer W is placed on the pins 63 of the bake section 17 (FIG. 9, 91). At this point, the pins 63 are projecting from the placement base 62 as shown in FIG. 5. Therefore, the wafer W is situated away from the placement base 62. This state is called a "pre-process" (FIG. 9, 92).

After passing the wafer W to the bake section 17, the main carrying means 16 carries other wafer W between other processing sections in accordance with a preset procedure.

Thereafter, in the bake section 17, the pins 63 are moved downward in accordance with a control signal from the control section 50, and thus the wafer W is placed on the surface of the placement base 62 as shown in FIG. 6 (FIG. 9, 93). The wafer W are heated by the placement base 62. This heating process is called "main process". (FIG. 9, 94).

Then, the bake section 17 moves the pins 63 upwards in accordance with a control signal from the control section 50, and thus the wafer W is lifted from the placement base 62 (FIG. 9, 95).

Before the completion of the main process, the control section 50 moves the main carrying means 16 which has been serving for other step, back in front of the bake section 17. After the bake section 17 lifts up the pins 63, the main carrying means 16 moves one of the wafer supporting arms 32 and 33, which is not being used, forward, and then upward, thus receiving the wafer W from the pins 63.

After the completion of the PEB process, the main carrying means 16 moves the wafer W from the bake section 17 to the cooling section 18 in accordance with the control of the control section 50 (FIG. 8, 84). In the cooling section 18, the wafer W is cooled by an ordinary method (FIG. 8, 85).

After that, the main carrying means 16 carries the wafer W from the cooling section 18 to the development section 20 in accordance with the control of the control section 50 (FIG. 8, 86). In the development section 20, the wafer W is developed by an ordinary method (FIG. 8, 87).

After the completion of the development, the main carrying means 16 passes the wafer W from the development section 20 to the carrier stage 11 (FIG. 8, 88), and the wafer W is stored in a carrier 12 by the carrying mechanism 14 of the carrier stage 11 (FIG. 8, 89).

In the process of a resist described above, the control section 50 controls the operation timings of the main carrying means 16 and the bake section 17 in the coating-development unit 15 in the following manner.

In the following description, various parameters respectively indicate the meanings described below.

$T_1$: a time required in the process in the exposure unit 23;

$T_2$: a time required until a wafer W which has been subjected to the exposure process at the interface 22, reaches the bake section 17;

$T_3$: a total time required for the PEB process in the bake section 17;

$T_4$: a time required in the cooling section 18;

$T_5$: a time required in the development section 20;

$T_6$: a time required in the adhesion section 19; and $T_7$: a time required in the coating section 21.

It should be noted that $T_3$ is a total of a pre-process time $t_1$, a main process time $t_2$ and a post-process time $t_3$, as shown in FIG. 10. The pre-process time $t_1$ is defined as a time period from when a wafer W reaches the bake section 17 to when the main process in which the wafer W is heated, is actually started. In other words, it is a time period from the point when the wafer W is passed on the pins 63 of the bake section 17 by the main carrying means 16, to the point where the wafer W is placed on the placement base 62 as the pins 63 descend.

The main process time $t_2$ is a time for the main process, more specifically, a time period in which the wafer W is actually heated on the placement base 62. The post-process time $t_3$ is defined as a time period from when the main process is finished to when the wafer W is passed again to the main carrying means 16 from the pins 63. The main process time $t_2$ and the post-process time $t_3$ are a substantially required time for the heat treatment of a wafer, that is, the PEB process.

The control section 50 determines a required time $T_1$ of the process in the exposure unit 23 on the basis of the exposure starting signal SIG (Es), the exposure in-progress signal (Ei) and the exposure end signal (Ee).

Next, the control section 50 determines a total required time $T_3$ for the PEB process on the basis of the required time $T_1$, so that the total required time $T_3$ satisfies a preset condition. The condition is that $T_3$ is $T_1$ or more ($T_3 \geq T_1$).

Of the total required time $T_3$ for the PEB process, the main process time $t_2$ should be maintained constant according to various conditions including the type of the resist. If the time $t_2$ is extended even slightly, a so-called overbaking occurs. On the other hand, the post-process time $t_3$ should preferably be as short as possible in terms of the prevention of overbaking. Therefore, of the total required time $T_3$, the main process time $t_2$ and the post-process time $t_3$ cannot be changed. Consequently, in order to prolong or shorten the pre-process time $t_1$, the pre-process time $t_1$ must be changed.

More specifically, in the case where the required time $T_1$ for the exposure is 110 seconds, the total required time $T_3$ for the PEB process must be set 110 seconds or more. Of the total required time $T_3$, the main process time $t_2$ is 90 seconds, and the post-process time $t_3$ is 1.5 seconds, both of which values are always constant. Therefore, the process time $t_1$ should be 110 seconds−(90 seconds+1.5 seconds)= 18.5 seconds or more.

The control section 50 controls the bake section 17 in order to achieve the total required time $T_3$ for the PEB process in accordance with the above-determined value. More specifically, in the step of the pre-process 92 shown in FIG. 9, after an elapse of the determined pre-process time $t_1$ from when the wafer W is placed on the pins 63, the pins 63 are moved downward, and the main process 93 is started.

As described above, by setting the total required time $T_3$ for the PEB process equal to or longer than the time $T_1$, it is assured that a wafer W is always placed on the intermediate stage 34 when the main carrying means 16 reaches the location close to the intermediate stage 34 of the interface 22, to receive a wafer W, and actually carries out the reception of the wafer W. Thus, a meaningless operation in which the main carrying means 16 carries out the operation of receiving a wafer W even if a wafer is not present on the intermediate stage 34 when the means 16 reaches the interface 22, and actually performs the operation of carrying a wafer W for the PEB process, the cooling process and the development process, without a wafer W, can be avoided. As a result, the throughput of the resist process on a wafer W can be improved.

In the resist processing system of the prior art, a wafer W which reached the intermediate stage 34 later than the predetermined timing, is held in the interface 22 until the main carrying means 16 returns to the interface 22. Therefore, the required time $T_2$ for a wafer W which has been exposed in the interface 22 to reach the bake section 17, is prolonged. In this case, if the resist is of a chemical sensitization type, the size of the exposed portion of the resist changes, a resist pattern of a desired size cannot be obtained after the development.

However, according to the present embodiment, a wafer W is not held in the intermediate stage 34 longer than necessary time, and therefore a resist pattern having a predetermined size can be obtained in the case where a chemical sensitization type resist is used. As described, in the process of the example, a required time $T_2$ for a wafer W which has been subjected to the exposure in the interface 22, to reach the bake section 17, can be maintained at constant.

Regardless of a change in the required time $T_1$ for the exposure, for some reason, the above-described effect of the present invention is not at all affected. In the resist process of this embodiment, the actual required time $T_1$ for one wafer W in the exposure process is determined, and the total required time $T_3$ for the best PEB process is determined based on the determined time $T_1$.

Further, the total required time $T_3$ for the PEB process can be extended or shortened by changing the pre-process time $t_1$. Therefore, the main process time $t_2$ and the post-process time $t_3$ can be maintained at constant. A wafer W at the pre-process stage, is slightly heated by the remaining heat in the bake section 17 in which another wafer was previously heated, for example, the radiation heat from the box 61. However, the temperature of the wafer W very slightly increases as shown in FIG. 10. After that, when the main process starts, the temperature of the wafer W is quickly increased, and during the main process time $t_2$, the temperature of the wafer W is maintained at a predetermined level, for example, 90° C. After the completion of the main process, the wafer W begins to quickly cool down in the post-process stage. For this reason, regardless of a change in the pre-process time $t_1$, the resist on the surface of the wafer W which was subjected to the PEB process, is not substantially affected. Therefore, the overbaking can be prevented.

Further, in the case where a plurality of wafers W are processed by the resist processing system 10 of this embodiment, the main process time $t_2$ and the post-process time $t_3$ for each wafer W can be maintained at constant. Therefore, the development of the resist can be performed substantially uniformly for the plurality of wafers W.

A more preferable condition for the total required time $T_3$ for the PEB is that the time $T_3$ is longer than the required time for the other processing section than the bake section 17 of the coating-development section 21, more specifically, each required times $T_4$ to $T_7$ in the cooling section 18, the development section 20, the adhesion section 19 and the coating section 21 ($T_3 > T_4$, $T_5$, $T_6$ or $T_7$). In this case, the required times $T_4$ and $T_5$ for the cooling section 18 and the development section 20 can be always maintained at constant. Consequently, the processing condition for the resist is rendered uniform between a plurality of wafers W, and the occurrence of defective products is suppressed, thus improving the yield. Since the required times $T_4$ to $T_7$ for the processing sections can be maintained always at constant, the time period in which the main carrying means 16, after passing a wafer W to the bake section 17, returns to a predetermined position close to the bake section 17 so as to receive the same wafer which was subjected to the PEB process (to be called as "1-cycle time period" for the main carrying means 16), can be maintained always at constant. Therefore, by presetting the 1-cycle time period for the main carrying means 16 so that the means 16 is already back at the predetermined position when the PEB process of a wafer W is finished, the 1-cycle time period for the main carrying means 16 is maintained always at constant, and therefore the post-process time $t_3$ can be shortened as much as possible.

One of the preferable examples of the resist process of the present invention is that the total required time $T_3$ for the PEB process and the required time $T_1$ for the exposure are equal to each other ($T_3 = T_1$). In this case, the wafer W with which the exposure was finished, is not left time-wastefully in the intermediate stage 34 of the interface 22, but received by the main carrying means 16 to be sent to the bake section 17. Further, when equalizing the total required time $T_3$ for the PEB with the required time $T_1$ for the exposure, the total required time $T_3$ for the PEB is changed by varying the pre-process time $t_1$. Thus, the main process time $t_2$ and the post-process time $t_3$ can be maintained at constant, and the PEB process conditions can be uniformed between a plurality of wafers W.

In the above-described embodiment, the required time $T_1$ for the process in the exposure unit 23 is determined on the basis of the exposure starting signal SIG (Es), the exposure in-progress signal SIG (Ei) and the exposure end signal (Ee). However, it is also possible to carry out a control operation similar to the above in the following manner. That is, an exposure time at the exposure unit 23 is input by an operator from the input means mounted in the exposure unit 23, and the same value is input to the control section 50 by the input means 100 mounted in the control section 50 shown in FIG. 2. Based on the input value, the control section 50 determines the required time $T_1$ at the exposure unit 23, and thus a control operation is carried out.

Further, it is also possible to carry out the control operation in the following manner. That is, an operator inputs an exposure time at the exposure unit 23 by means of the input means equipped in the exposure unit 23, and the input value is transmitted as a signal to the control unit 50 from the exposure unit 23 via a signal transmission system. Based on the input signal, the control section 50 determines the required time $T_1$ for the process at the exposure unit 23, and thus a control operation is carried out.

Further, the required time for the process at the exposure unit 23 may be determined by the control section 50 after the placement of a wafer W on the input-side stage 24 by the interface 22, and on the basis of the output-side wafer passing signal SIG (OUT) from the exposure unit 23.

In practice, the setting and varying of the pre-process time $t_1$ can be performed on the first wafer W of a wafer W lot by the control section 50.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resist processing apparatus for performing a resist process on a substrate, comprising:

a coating unit for coating a resist film on surface of the substrate;

an interface unit for passing a substrate between the interface unit itself and an exposure device;

a heat treatment unit for carrying out a heat treatment on said substrate having the surface on which the resist film is formed by the coating unit, said resist film being exposed to light by the exposure device;

a cooling unit for cooling said substrate on which the heat treatment was carried out by said heat treatment unit;

a development unit for developing said resist film formed on the surface of said substrate which was cooled by said cooling unit;

substrate carrying means for carrying said substrate between said heat treatment unit, said cooling unit, said development unit and said interface unit; and a control unit configured to control an operation of at least said heat treatment unit and said substrate conveying means and of changing a required time for a post-exposure-baking process at said heat treatment unit in accordance with a required time for a process of said substrate at said exposure device.

2. An apparatus according to claim 1, wherein said required time for the post-exposure-baking process at said heat treatment unit consists of a pre-process time period from when said substrate is passed to said heat treatment unit from said substrate carrying means to when the heat treatment is started and a heat treatment time period from when the heat treatment is substantially started to when the substrate is passed again to the substrate carrying means.

3. An apparatus according to claim 2, wherein said control unit changes the required time for the post-exposure-baking process at said heat treatment unit by changing said pre-process time.

4. An apparatus according to claim 1, wherein said control unit equalizes the required time for the post-exposure-baking process at said heat treatment unit with the required time for the process at said exposure device, or makes the required time for the process at said heat treatment unit longer than that of said exposure unit.

5. An apparatus according to claim 4, wherein said control unit equalizes the required time for the post-exposure-baking process at said heat treatment unit with the required time for the process at said exposure device.

6. An apparatus according to claim 4, wherein said control unit makes the required time for the post-exposure-baking process at said heat treatment unit longer than those of the processes at a cleaning unit and the development unit.

7. An apparatus according to claim 1, wherein said control unit determines the required time of the process at the exposure device on the basis of an output signal from the exposure device.

8. An apparatus according to claim 7, wherein said control unit determines the required time for the process at the exposure device on the basis of at least an exposure starting signal and an exposure finishing signal from the exposure device.

9. An apparatus according to claim 7, wherein said control unit determines the required time of the process at the exposure device on the basis of a signal of an exposure time at said exposure device input to said exposure device, which is transmitted from said exposure device to said control unit.

10. An apparatus according to claim 1, wherein said control unit includes input means and determines a required time for the process at the exposure device on the basis of an exposure time at the exposure device, input from said input means.

11. An apparatus according to claim 1, wherein said heat treatment unit includes a placement base configured to heat the substrate placed on a surface thereof, and a substrate supporting mechanism capable of supporting said substrate away from said placement base and placing said substrate on said placement base.

12. An apparatus according to claim 11, wherein said control unit changes the the required time for the post-exposure-baking process at the heat treatment unit by changing a time period from when said substrate supporting mechanism receives said substrate from the substrate carrying means to when said substrate supporting mechanism places said substrate on said placement base.

13. An apparatus according to claim 11, wherein said substrate supporting mechanism includes a plurality of pins descendably pierced through said placement base, for supporting said substrate by upper end portions of the pins, a frame on which said pins are fixed, and a lifting mechanism for moving said frame upward/downward.

14. An apparatus according to claim 13, wherein said control unit makes the required time for the process at said heat treatment unit longer than those of the processes at a cleaning unit and the development unit.

15. An apparatus according to claim 14, wherein said coating unit coats the surface of the substrate with a chemically amplified resist film.

* * * * *